(12) United States Patent
Rochel et al.

(10) Patent No.: US 7,534,679 B2
(45) Date of Patent: May 19, 2009

(54) SYSTEM AND METHOD FOR PRODUCING A SEMICONDUCTOR CIRCUIT ARRANGEMENT

(75) Inventors: Markus Rochel, Dresden (DE); Armin Tilke, Dresden (DE); Cajetan Wagner, Dresden (DE)

(73) Assignee: Infineon Technologies AG, Munich (DE)

(*) Notice: Subject to any disclaimer, the term of this patent is extended or adjusted under 35 U.S.C. 154(b) by 211 days.

(21) Appl. No.: 11/586,433

(22) Filed: Oct. 25, 2006

(65) Prior Publication Data

US 2007/0224747 A1 Sep. 27, 2007

Related U.S. Application Data

(63) Continuation of application No. PCT/EP2005/051806, filed on Apr. 22, 2005.

(30) Foreign Application Priority Data

Apr. 30, 2004 (DE) .................. 10 2004 021 240

(51) Int. Cl.
*H01L 21/8238* (2006.01)
(52) U.S. Cl. .................. 438/202; 257/E21.382
(58) Field of Classification Search .................. 438/202
See application file for complete search history.

(56) References Cited

U.S. PATENT DOCUMENTS 6,051,456 A * 4/2000 Davies et al. ............... 438/202

(Continued)

FOREIGN PATENT DOCUMENTS

WO WO 03/049191 6/2003

OTHER PUBLICATIONS

D. Knoll et al.; "A Flexible, Low-Cost, High Performance SiGe:C BiCMOS Process with a One-Mask HBT Module"; IEE; Frankfurt, Germany; pp. 783-786; 2002.

(Continued)

*Primary Examiner*—W. David Coleman
(74) *Attorney, Agent, or Firm*—Brinks Hofer Gilson & Lione (57) ABSTRACT

Method and systems for producing a semiconductor circuit arrangement are disclosed. In one implementation, after a formation of a first electrically conductive layer at the surface of a semiconductor substrate for the purpose of realizing a base connection layer and a first split gate layer, an implantation mask is formed for the purpose of carrying out a first collector implantation for the purpose of forming a collector connection zone. After the formation of a hard mask layer and a first etching mask, the hard mask layer is patterned and an emitter window is uncovered using the patterned hard mask layer. Using the patterned hard mask layer a second collector implantation is effected for the purpose of forming a collector zone, a base layer being formed in the region of the emitter window. Afterward, using a second etching mask, a field effect transistor region is uncovered and the patterned hard mask layer is removed in this region in order finally to form a second electrically conductive layer over the whole area for the purpose of realizing an emitter layer and a second split gate layer. Both the bipolar transistor and the field effect transistor are subsequently completed in a customary manner, in particular a source/drain implantation being used simultaneously for the doping of the emitter layer. Since the gate is deposited in two layers, the first layer simultaneously serving as base connection layer and the second layer simultaneously serving as emitter layer, up to two lithography planes can be obviated and costs can thereby be saved.

18 Claims, 11 Drawing Sheets

U.S. PATENT DOCUMENTS

| | | | |
|---|---|---|---|
| 6,169,007 B1 * | 1/2001 | Pinter | 438/320 |
| 6,215,160 B1 * | 4/2001 | Suda | 257/370 |
| 6,399,993 B1 * | 6/2002 | Ohnishi et al. | 257/370 |
| 6,429,085 B1 | 8/2002 | Pinter | |
| 6,441,441 B1 | 8/2002 | Suda | |
| 6,633,069 B2 * | 10/2003 | Nii et al. | 257/370 |
| 2003/0157774 A1 * | 8/2003 | Tominari et al. | 438/312 |

OTHER PUBLICATIONS

German Office Action dated Apr. 30, 2004 and English Translation.

* cited by examiner

SYSTEM AND METHOD FOR PRODUCING A SEMICONDUCTOR CIRCUIT ARRANGEMENT

RELATED APPLICATIONS

The present application is a continuation application of PCT Application Ser. No. PCT/EP2005/051806, which claims priority to German Patent Application Serial Number DE 10 2004 021 240.6, filed Apr. 30, 2004, the entirety of both of which are hereby incorporated herein by reference.

BACKGROUND

The present disclosure relates to a method for producing a semiconductor circuit arrangement, and in particular to a method for producing a BICMOS circuit arrangement having a reduced number of lithography planes.

Integrated radiofrequency circuits are usually realized in so-called BiCMOS technologies. This requires bipolar transistors in the circuit sections which make stringent demands in respect of low noise and radio-frequency suitability. Although in modern CMOS technologies the field effect transistors or the limiting frequencies thereof are almost sufficient to replace the bipolar transistor, the noise performance, in particular, remains inadequate. Although pure CMOS circuits are accordingly gaining more and more acceptance over BiCMOS circuits in particular with regard to their wafer costs, the performance features or the performance of BiCMOS circuits cannot yet be achieved, however.

However, conventional BiCMOS technologies require a multiplicity of lithography planes and thus of very cost-intensive lithography masks and also additional process steps in order to integrate the bipolar transistor into the CMOS process.

SUMMARY

The present disclosure is therefore based on the object of providing a method for producing a BiCMOS circuit arrangement which has a reduced number of lithography planes and furthermore enables high-performance circuits in particular with regard to radiofrequency and noise behavior.

The preparation of a semiconductor substrate with a bipolar transistor region and a field effect transistor region is followed by firstly forming a first electrically conductive layer for the purpose of realizing a base connection layer in the bipolar transistor region and a first split gate layer in the field effect transistor region. Afterward, an implantation mask is formed and, using this mask, a first collector implantation is carried out for the purpose of forming a collector connection zone in the bipolar transistor region. This is followed by forming a hard mask layer and a first etching mask for the purpose of patterning the hard mask layer and for the purpose of uncovering an emitter window in the bipolar transistor region, the base connection layer subsequently being patterned using the patterned hard mask layer. Afterward, using the patterned hard mask layer and the base connection layer, a second collector implantation is carried out for the purpose of forming a collector zone and a base layer for the later bipolar transistor is formed in the region of the emitter window at the surface of the collector zone and at the sidewalls of the base connection layer. Afterward, a second etching mask is formed at the surface of the patterned hard mask layer for the purpose of uncovering the field effect transistor region and the patterned hard mask layer is patterned anew using the second etching mask. It is followed by forming a second electrically conductive layer at the surface of the first electrically conductive layer and the patterned hard mask layer and by forming a third etching mask at the surface of the second electrically conductive layer. This is followed by patterning the second electrically conductive layer using the third etching mask for the purpose of realizing an emitter layer for the bipolar transistor in the region of the emitter window and a second split gate layer for a field effect transistor in the field effect transistor region.

The bipolar transistor and the field effect transistor are finally completed in accordance with conventional methods. In particular through the combination of a split poly concept for the gate of the field effect transistor with a lateral growth concept of the base layer for the bipolar transistor, a multiplicity of lithography planes can be obviated, for which reason a high-performance bipolar transistor can be integrated cost-effectively with only three additional lithography planes or masks with respect to a conventional CMOS process.

Polycrystalline semiconductor materials, and in particular polysilicon, are preferably used for the first and second electrically conductive layers, whereby the control layer or the gate of the field effect transistor can be produced in a particularly simple manner.

Furthermore, it is possible to carry out a base connection implantation using the implantation mask for the collector implantation for the purpose of doping the base connection layer, whereby a very low-resistance base connection is obtained without additional costs.

In particular, through the use of a selective epitaxy method for laterally growing a side base layer and for horizontally growing a bottom base layer, a bipolar transistor having outstanding electrical properties can be integrated into a CMOS process in a very simple and thus cost-effective manner.

Furthermore, it is possible to form a collector connection window in the bipolar transistor region for a collector connection using the first etching mask, whereby a collector connection resistance can be reduced further and the electrical properties of the bipolar transistor are thereby improved further.

BRIEF DESCRIPTION OF THE DRAWINGS

The systems and methods are described in more detail below on the basis of exemplary embodiments with reference to the drawing.

FIGS. 1A to 1O show simplified sectional views for illustrating one embodiment of a method for producing a BiCMOS circuit arrangement;

DETAILED DESCRIPTION OF THE DRAWINGS

Figure 1A:
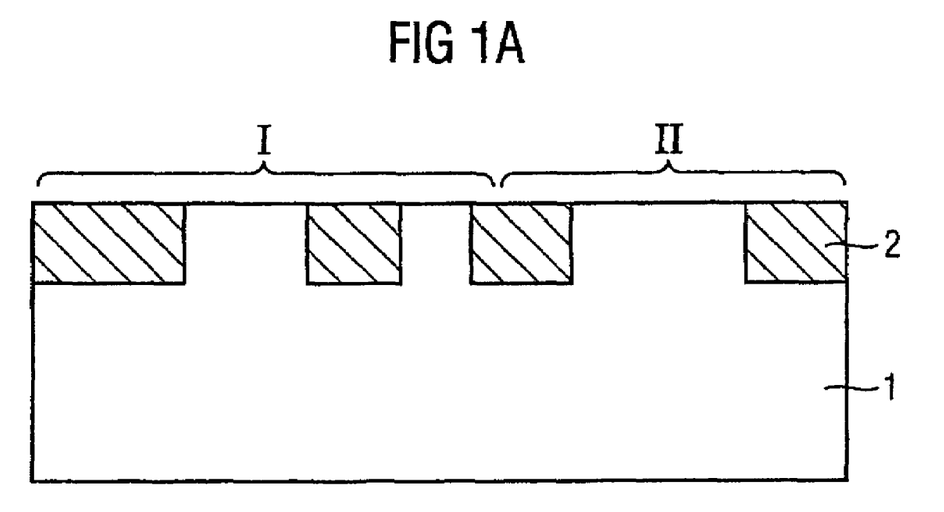

FIGS. 1A to 1O show simplified sectional views for illustrating method steps in the production of a BiCMOS circuit arrangement, wherein a high-performance bipolar transistor can be produced or integrated cost-effectively with only three additional lithography planes relative to a conventional CMOS process.

In accordance with FIG. 1A, the first step involves preparing a semiconductor substrate 1 with a bipolar transistor region I, in which a later bipolar transistor is formed, and a field effect transistor region II in which a later field effect transistor or a CMOS circuit is formed. By way of example, a silicon semiconductor substrate or a silicon semiconductor wafer is used as semiconductor substrate 1, isolation trenches 2 such as, for example, a shallow trench isolation (STI) being formed for the purpose of realizing active zones at the surface of the semiconductor substrate 1.

In accordance with FIG. 1B, a subsequent step involves forming a dielectric layer at the surface of the semiconductor substrate 1, which, in particular in the field effect transistor region II, constitutes a so-called gate dielectric 3 for a later field effect transistor. By way of example, an $SiO_2$ layer is formed at the uncovered semiconductor regions of the semiconductor substrate 1 by thermal oxidation, whereby a gate oxide is obtained as gate dielectric 3.

Figure 1B:
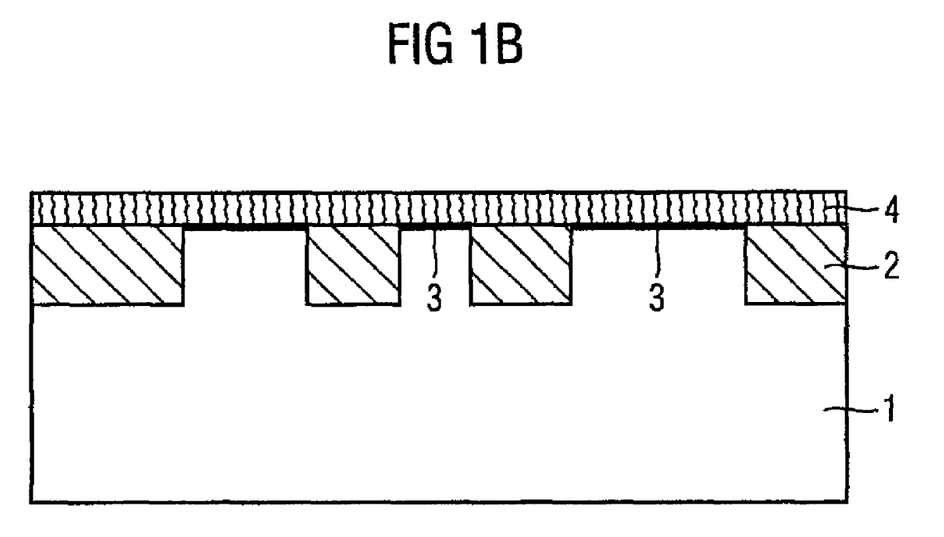

Afterward, in accordance with FIG. 1B, a first electrically conductive layer 4 is formed over the whole area at the surface of the semiconductor substrate 1 or at the surface of the gate dielectric 3 and the trench isolation 2. It is preferably the case here that an initially undoped or weakly-doped polycrystalline semiconductor layer and in particular polysilicon, is deposited over the whole area as first electrically conductive layer 4 by means of a CVD process, for example. The first electrically conductive layer 4 is used in later method steps for realizing a base connection layer 4A for the bipolar transistor in the bipolar transistor region I for realizing a first split gate layer 4B for the field effect transistor in the field effect transistor region II. In this case, splitting the field effect transistor gate into two layers is an important step for the cost-effective integration of a high-performance bipolar transistor in a CMOS process.

Figure 1C:
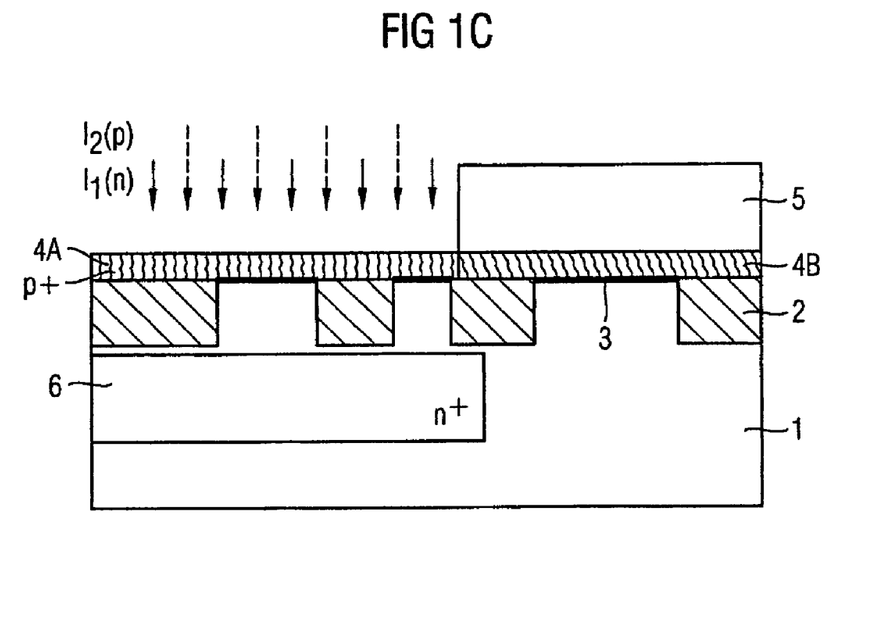

In accordance with FIG. 1C, an implantation mask 5 is subsequently formed at the surface of the semiconductor wafer or the first electrically conductive layer 4, in which case, by way of example, a photoresist is spun on over the whole area and subsequently patterned by means of photolithographic methods, i.e. exposed, developed and the exposed regions are removed. The implantation mask 5 is then used to effect a first collector implantation $I_1$ for the purpose of forming a collector connection zone 6 in the semiconductor substrate 1. To put it more precisely, by way of example, an n-type high-energy implantation is carried out for the purpose of realizing a buried layer for the collector connection zone, as a result of which an $n^+$-type collector connection zone arises below the trench isolation 2 in the bipolar transistor region I. For the defined definition of an active zone for a bipolar transistor, the shallow trench isolation 2 is formed for example in such a way that it defines a region for the later collector zone and a contact region for connecting the collector connection zone 6.

Optionally, using the same implantation mask 5, it is furthermore possible to carry out a base connection implantation $I_2$ for the purpose of doping the polycrystalline semiconductor layer 4 as low-resistance base connection layer 4A. A p-type low-energy implantation is preferably carried out in this case, whereby a heavily $p^+$-doped base connection layer 4A, for example, is obtained using the same mask. Such a very low-resistance base connection layer 4A is important for the electrical properties of the later bipolar transistor and can accordingly be realized cost-effectively using the same implantation mask 5.

Figure 1D:
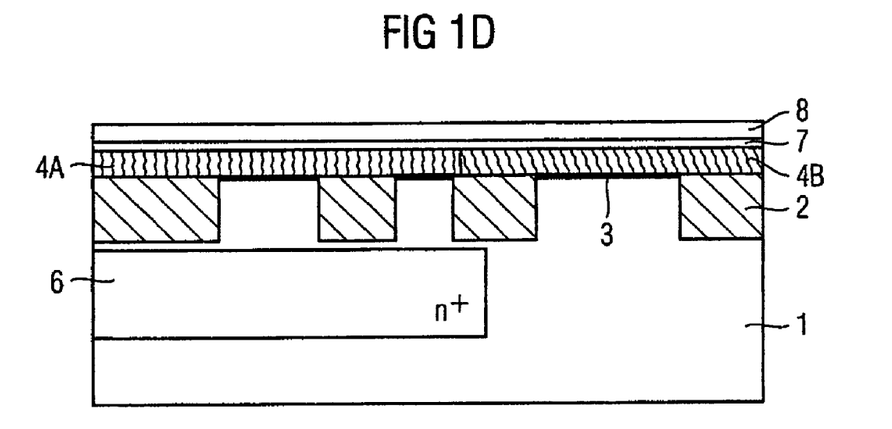

In accordance with FIG. 1D, after the removal of the implantation mask 5, that is to say after a resist strip, a hard mask layer or insulation layer (for realizing an insulation between a layer emitter layer and a later base connection layer) is formed over the whole area at the wafer surface or the surface of the first electrically conductive layer 4, which is split into the base connection layer 4A and the non-implanted layer region or the first split gate layer 4B. To put it more precisely, a double layer comprising an oxide 7 and a nitride 8 may be formed at the surface of the first electrically conductive layer 4, in which case the layer order may preferably be inverted, that is to say nitride at the bottom and oxide at the top. In principle, it is also possible to use only a single insulation layer, e.g. oxide, as a hard mask layer of this type. An $SiO_2$ layer 7 is for example, deposited directly at the surface of the polycrystalline semiconductor layer 4 and an $Si_3N_4$ layer 8 is deposited thereon. In this case, the oxide layer 7 of the hard mask layer furthermore serves as an etching stop layer for a later method step.

Figure 1E:
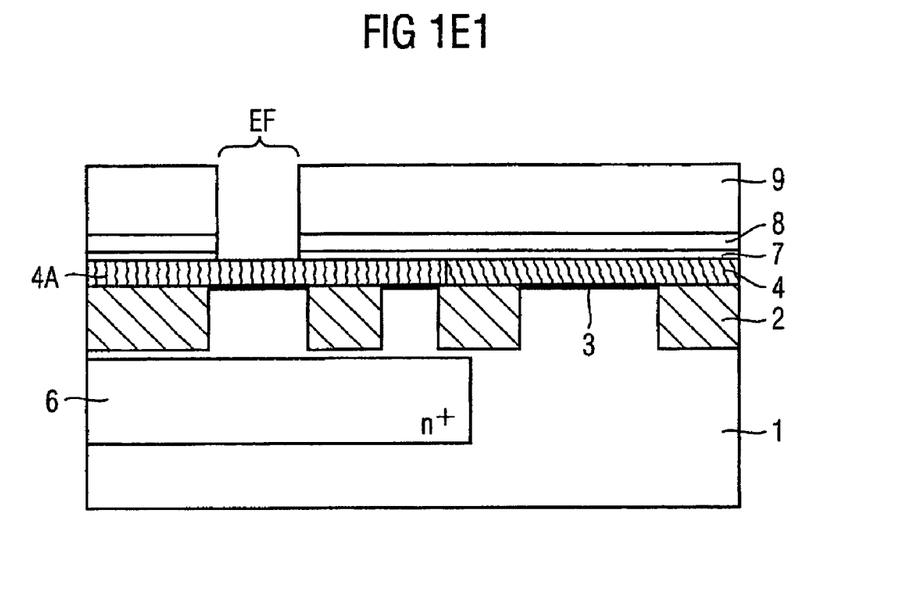

In accordance with FIG. 1E1, a first etching mask 9 is subsequently formed again at the surface of the semiconductor wafer or the hard mask double layer 7 and 8 in which case for example a photoresist is again spun on over the whole area and patterned by means of photolithographic methods in order to realize or uncover an emitter window EF. The hard mask layer 7 and 8 is subsequently patterned using this photomask 9, a dry etching method preferably being carried out for etching the nitride layer 8 and also the oxide layer 7 and for uncovering the electrically conductive first layer 4 for the base connection layer 4A.

Figure 1E:
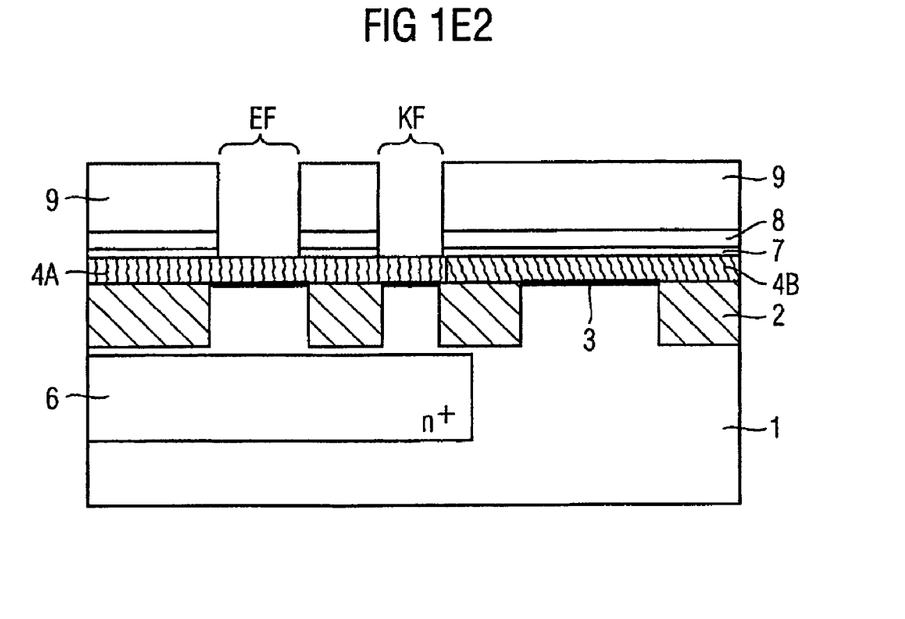

Alternatively or optionally, it is also possible, in accordance with FIG. 1E2, for a collector connection window KF to be formed in the bipolar transistor region and be transferred into the hard mask layer 7 and 8.

In accordance with FIG. 1F, the procedure subsequently involves removing the first etching mask 9 by means of a further resist strip, for example, and patterning the electrically conductive layer 4, and in particular the latter's partial region of the base connection layer 4A, using the patterned hard mask layer or the nitride layer 8 and the oxide layer 7. Preferably, in this case a further dry etching method is carried out for the purpose of removing the polycrystalline base connection layer 4A in the emitter window region EF and alternatively also in the collector window region KF (not illustrated).

Figure 1F:
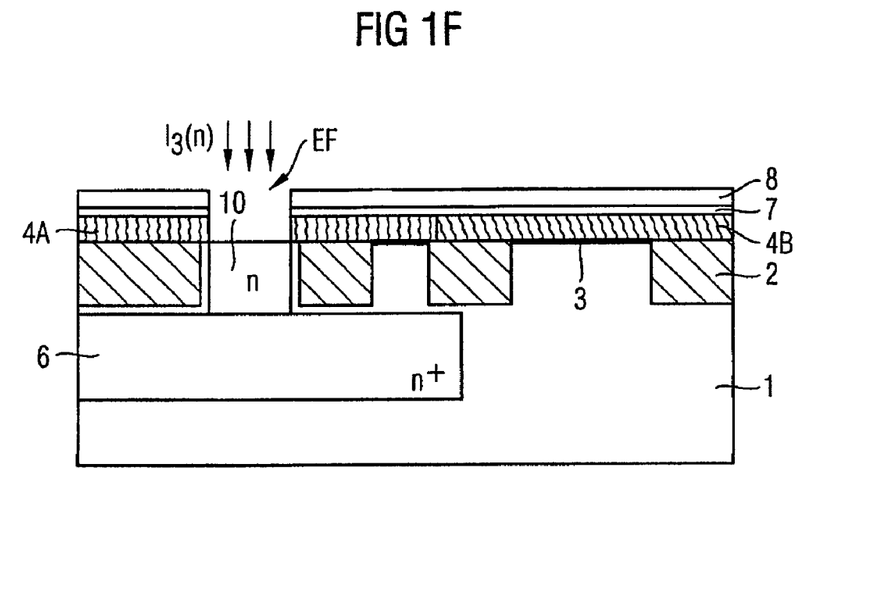

Furthermore, in accordance with FIG. 1F a second collector implantation $I_3$ is carried out using the hard mask layer patterned in this way and also the base connection layer 4A, whereby a collector zone 10 may be formed at the surface of the semiconductor substrate 1. In this case, the collector zone 10 preferably reaches as far as the collector connection zone 6 and has an identical doping (e.g. n-type), though a lower dopant concentration is used in order to avoid a deterioration in performance of the bipolar transistor. Finally, the gate oxide situated at the surface is stripped if this gate dielectric 3 was formed in this region, too, and is still present. In principle, the removal of said gate dielectric may also already be carried out at an earlier point in time.

Figure 1G:
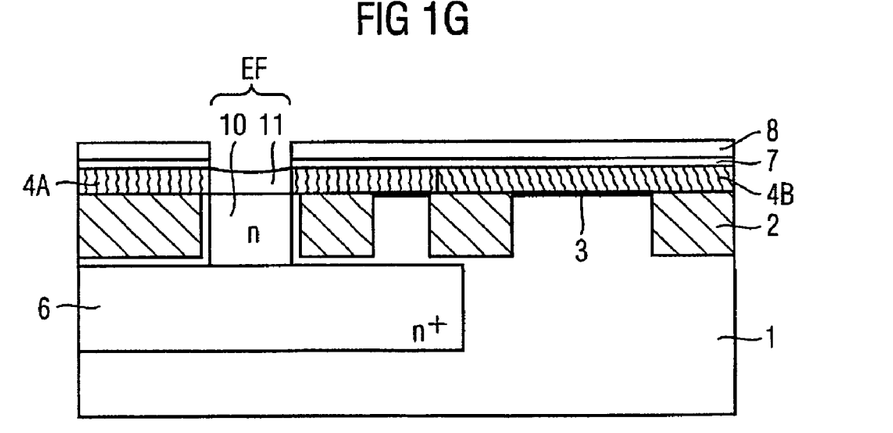

In the case where the alternative in accordance with FIG. 1E2 is realized, at this point in time the region in the collector connection window KF as far as the collector connection zone 6 is likewise doped in order to form a second collector connection zone 10A (see FIG. 1I2), thus resulting in lower connection resistances.

In accordance with FIG. 1G, a base layer 11 for the later bipolar transistor is then formed in the region of the emitter region EF both at the surface of the semiconductor substrate 1 or at the collector zone 10 and at the sidewalls of the highly-doped polycrystalline base connection layer 4A.

To illustrate this method step, attention is furthermore drawn to the partially enlarged sectional view in accordance with FIG. 2, wherein identical reference symbols designate layers identical or corresponding to those in FIG. 1G, for which reason a repeated description is dispensed with below.

Figure 2:
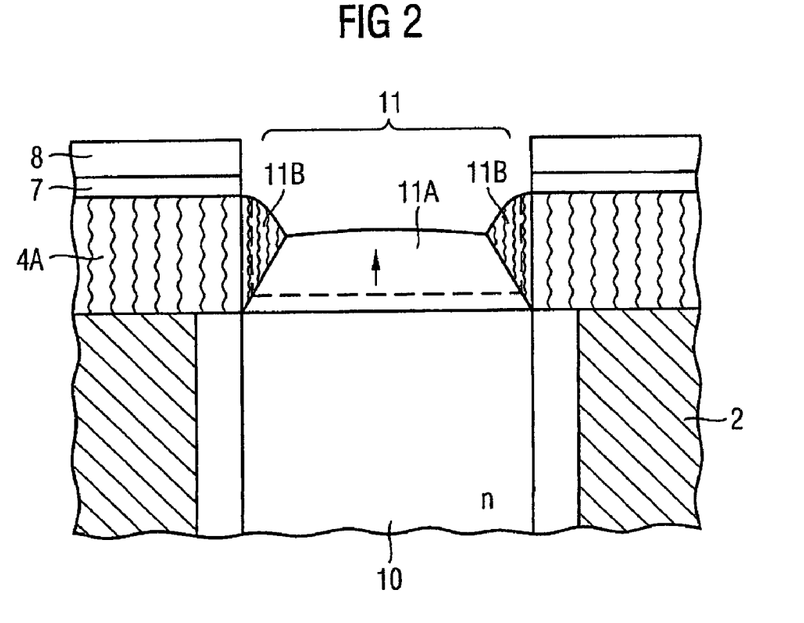
FIG. 2 shows a partially enlarged sectional view of FIG. 1G.

In accordance with FIG. 2, by way of example, a selective epitaxy method is used to implement a side base layer 11B at the sidewalls of the polycrystalline base connection layer 4A and for horizontally growing a bottom base layer 11A at the surface of the monocrystalline semiconductor substrate of the collector zone 10. Since the base connection layer 4A has polycrystalline semiconductor material, while the collector zone 10 has monocrystalline semiconductor material, the side base layers 11B essentially have polycrystalline semiconductor material, while the bottom base layer 11A has a monocrystalline semiconductor structure. SiGe or SiGe:C is preferably grown as a compound semiconductor during this selective epitaxy, whereby particularly high-performance bipolar transistors can be formed.

The base layer 11 should furthermore have a lower doping than the base connection layer 4, in order, for example to enable high current gain factors in the bipolar transistor (customary dopings for the base are 10E18 to 10E19 cm$^{-3}$, and for the base connection approximately 10E20 cm$^{-3}$). Since, on the other hand, the very highly doped base connection layer 4A extends right up to the base layer 11 in a self-aligned manner, a bipolar transistor of extremely high quality in particular with regard to its noise behavior and its radiofrequency performance is made possible in accordance with the present method.

Figure 1H:
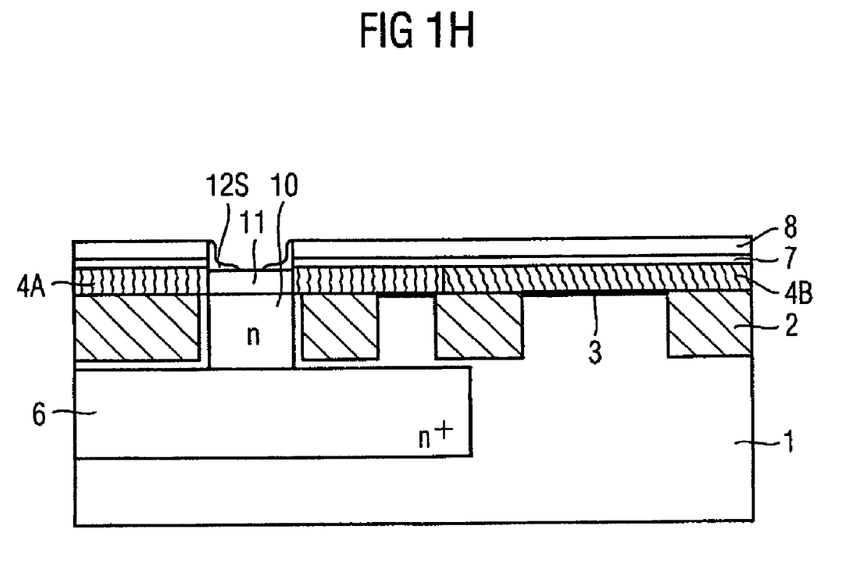

In accordance with FIG. 1H, a subsequent step involves forming an inner spacer 12S at the inner sidewalls of the emitter window EF or the hard mask layer comprising the layers 7 and 8. Such inner spacers 12S restrict an actually acting or effective emitter window to monocrystalline zone, whereby it is possible for example to reliably prevent an undefined lateral migration of dislocations from the polycrystalline regions of the active inner base. The inner spacers 12S are preferably formed in L-shaped fashion, which is described in detail below with reference to the partially enlarged sectional view in accordance with FIG. 3.

Figure 3:
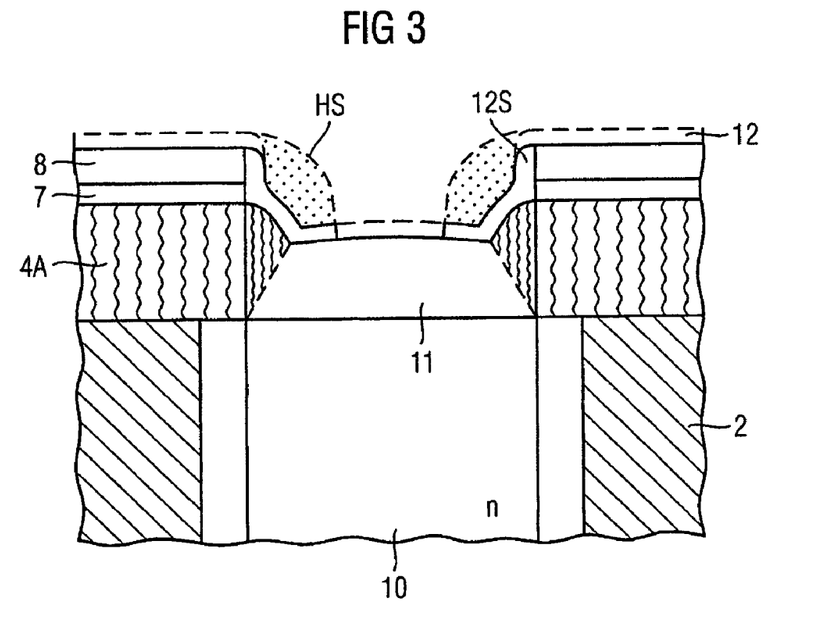
FIG. 3 shows a partially enlarged sectional view of FIG. 1H.

FIG. 3 accordingly shows a partially enlarged sectional view of FIG. 1H, wherein identical reference signals designate identical or corresponding elements or layers, for which reason a repeated description is dispensed with below.

In order to realize L-shaped inner spacers 12S, a double deposition, for example, is carried out, wherein firstly an inner spacer layer 12 is deposited over the whole area and conformally at the surface of the wafer or the hard mask layer and also the base layer 11 and afterward a further auxiliary layer is deposited for the purpose of realizing an auxiliary spacer HS and is pulled back by means of a spacer method. Using said auxiliary spacers HS, the inner spacer layer 12 is subsequently etched back in turn by means of a spacer method until the inner spacers 12S are finally produced in an essentially L-shaped fashion. After the removal of the auxiliary spacers HS, the inner spacers 12S accordingly remain at the sidewalls of the hard mask layer and also at the declivitous flanks of the side base layer 11B, whereby an effective emitter window is formed exclusively above the monocrystalline region of the bottom base layer 11A. Bipolar transistors having extremely favorable radiofrequency behavior and optimum noise properties are obtained with a structure of this type.

Figure 1I:
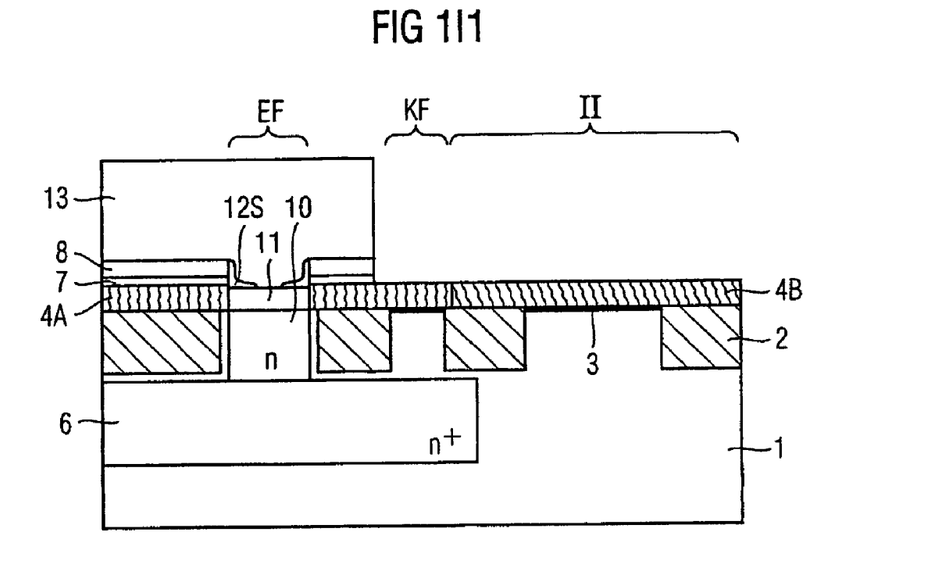
Figure 1I:
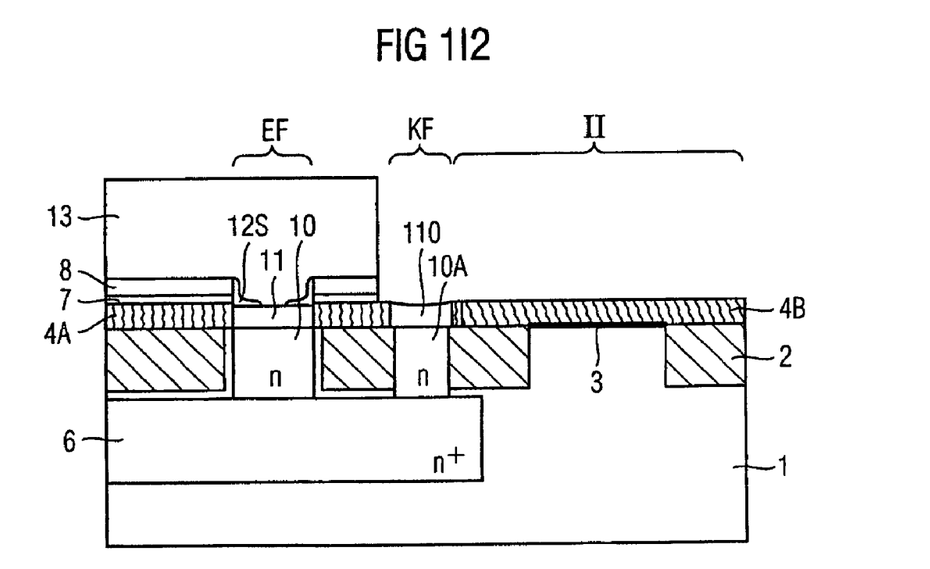

In accordance with FIG. 1I1, a second etching mask 13 is subsequently formed at the surface of the wafer or the patterned hard mask layer 7 and 8 for the purpose of uncovering the field effect transistor II. A photoresist is again applied over the whole area and exposed and developed for example by means of photolithographic methods and the exposed regions are removed, as a result of which at least the field effect transistor or CMOS region I1 is uncovered. In accordance with FIG. 1I1, the second etching mask 13 may also be patterned in such a way that the collector connection window KF is also uncovered in order subsequently, using said second etching mask 13, to remove the patterned hard mask layer or the nitride layer 8 and the oxide layer 7 for the purpose of uncovering the first electrical layer 4 in the field effect transistor region and the region of the collector connection window KF.

In this case, a dry etching method may again be carried out for the purpose of removing the hard mask layer, it also being possible to employ a more cost-effective wet etching method on account of the noncritical mask structure.

FIG. 1I2 shows the alternative version again, in which case, in the collector connection window KF, the second collector connection zone 10A was formed in low-resistance fashion in the semiconductor substrate 1 during the implantation in accordance with FIG. 1A and a sacrificial base layer 11A was furthermore grown at the surface of this further collector connection zone 10A and at the side area of the base connection zone 4A and of the non-implanted electrically conductive first layer 4B.

Figure 1J:
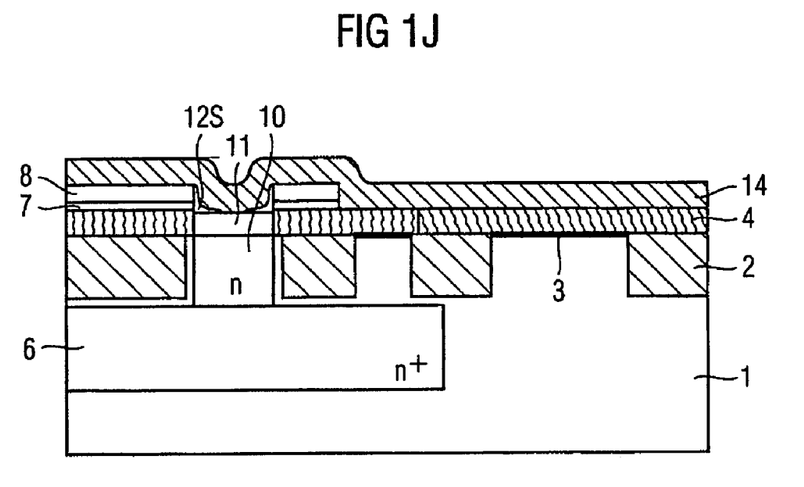
Figure 1K:
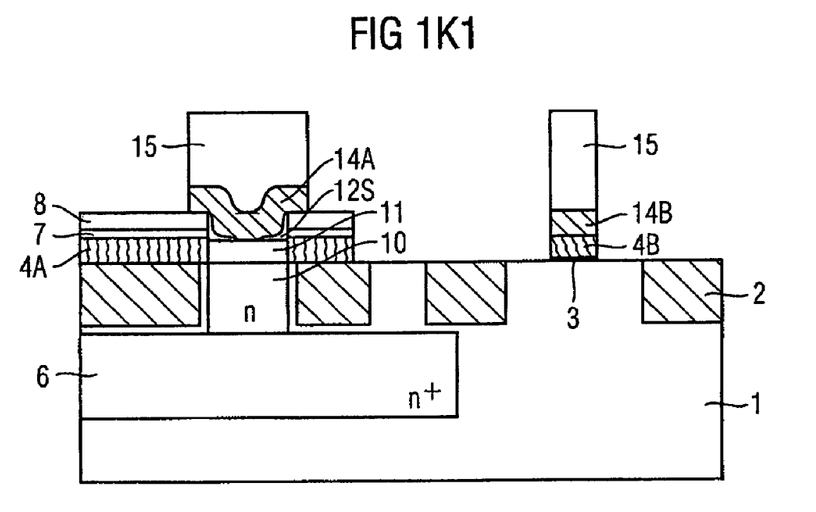

Returning to the basic method again, in a subsequent step in accordance with FIG. 1J, a second electrically conductive layer 14 is formed over the whole area at the wafer surface or at the surface of the first electrically conductive layer 4 and the patterned hard mask layer 7 and 8. Preferably, polycrystalline semiconductor material is again deposited by means of a deposition method, and in particular polysilicon, as second electrically conductive layer 14 of this type. The polysilicon serves as later emitter layer or emitter poly 14A in the bipolar transistor region, and simultaneously serves as a later second gate polysilicon layer or a second split gate layer 14B in the field effect transistor region.

Prior to this deposition, of course, firstly the second etching mask 13 is removed or a photoresist strip is carried out and an HF cleaning of the polycrystalline semiconductor surface of the second electrically conductive layer 14 is optionally carried out.

In accordance with FIG. 1K1, in the preferred exemplary embodiment, a third etching mask 15 is formed at the wafer surface or the surface of the second electrically conductive layer 14, a photoresist again being applied or spun on and being patterned by means of photolithographic methods, i.e. exposed, developed and the exposed regions are removed. Using the third etching mask 15, which now already corresponds to a conventional gate lithography or gate etching mask of a conventional CMOS process, the second electrical layer 14 and also the underlying first electrically conductive layer 4 are patterned for the purpose of realizing an emitter layer 14A in the region of the emitter window EF and a second split gate layer 14B or a gate stack in the field effect transistor region. By way of example, a dry etching method (RIE, Reactive Ion Etch) is carried out in this case, since a critical mask and thus very fine structures are involved in this case.

Figure 1K:
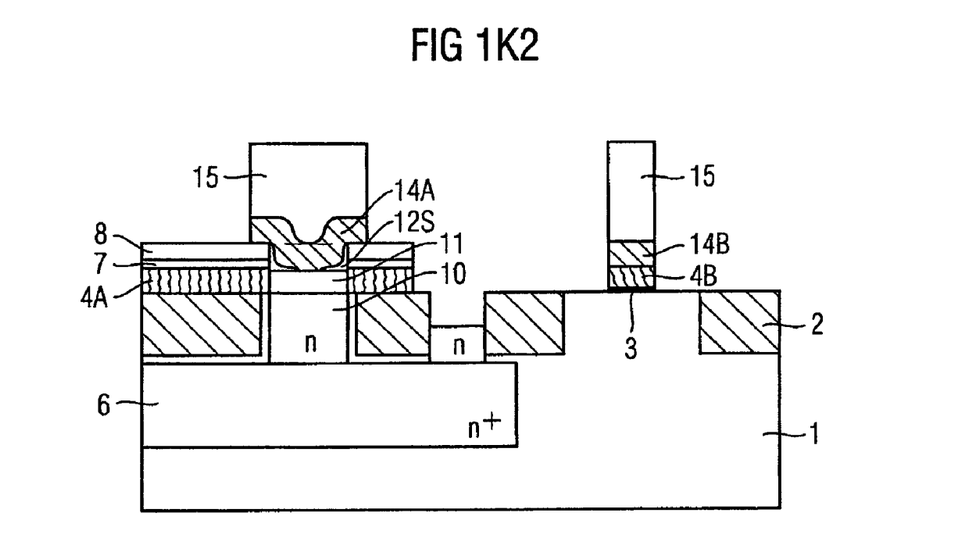

In the alternative version in accordance with FIG. 1K2, on account of the lack of the first electrically conductive layer 4 and the underlying gate dielectric 3 acting as an etching stop in the region of the collector connection window KF, the sacrificial base layer 11O or the SiGe epitaxial layer is completely removed and etching into the semiconductor substrate 1 furthermore takes place, thus resulting in a depression that is laterally bounded by two isolation trenches 2, for example.

The further steps in accordance with FIGS. 1L to 1O describe the completion of a bipolar transistor in the bipolar transistor region I and a field effect transistor in the field effect transistor region II using potentially known production steps. The step for realizing a cost-effective integration of a bipolar transistor in a circuit comprising field effect transistors or a CMOS circuit consists, in particular in splitting the field effect transistor control layer or gate into two layers 4B and 14B. In combination with, in particular, a selective SiGe epitaxy for forming the base layer 11, a BiCMOS circuit arrangement with a high-performance bipolar transistor is obtained using just three additional lithography masks or lithography planes with respect to a conventional CMOS process.

Since the emitter window geometry or the emitter layer 14E is virtually planar in the present invention, it is furthermore possible to use an implanted emitter poly. Owing to the planar geometry, an emitter edge depletion in the case of very deep emitter windows is thereby reliably prevented even without the use of an expensive in situ-doped emitter poly.

The method is preferably combined with modern CMOS processes which realize gate lengths of less than 100 nanometers and thus dispense with a post-oxide (gate reoxidation). A cost-effective realization is possible in a particularly simple manner in this case.

The steps required for completing the bipolar transistor and the field effect transistor are described in detail below.

Figure 1L:
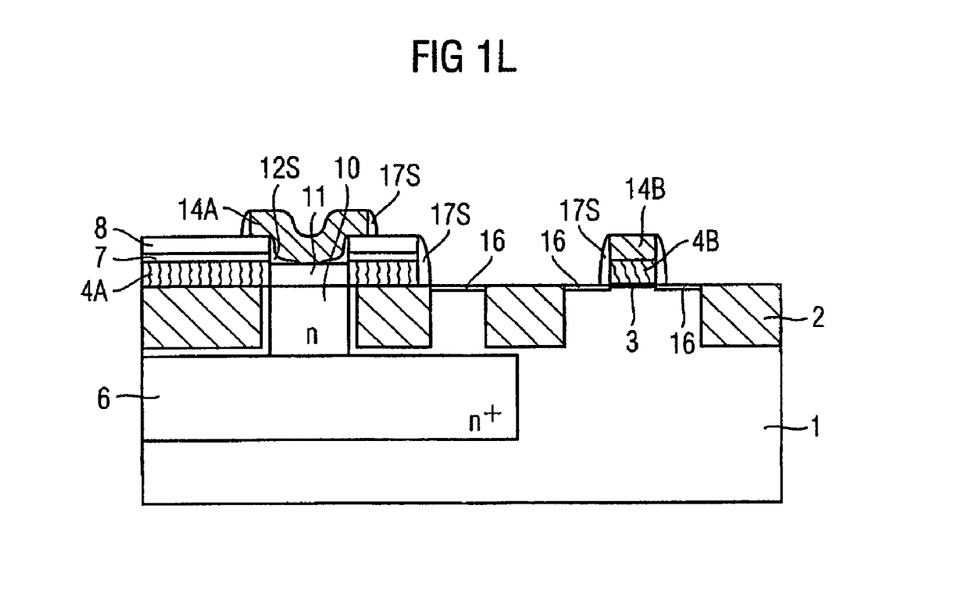
Figure 1M:
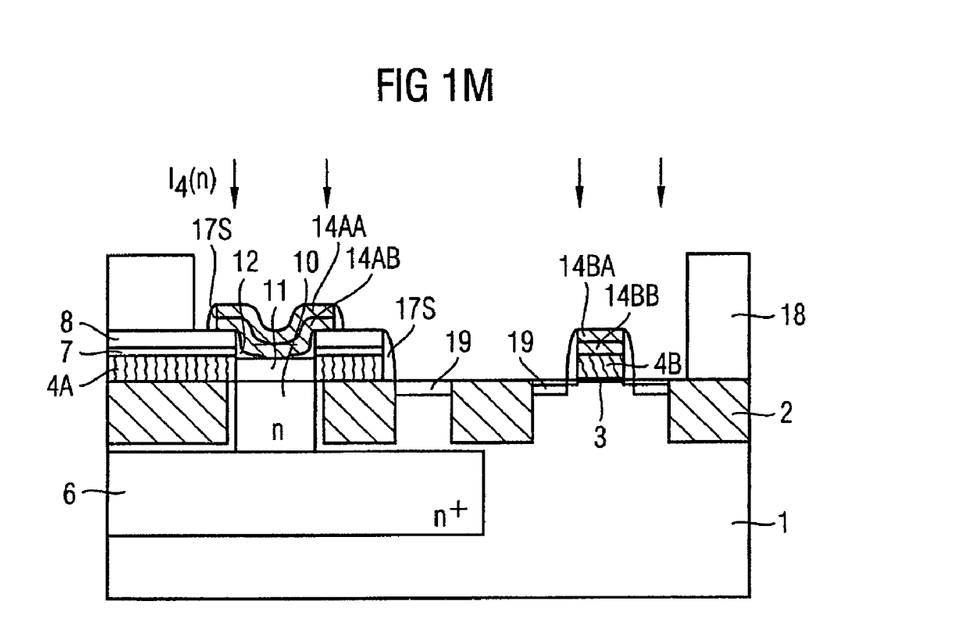

In accordance with FIG. 1L, so-called "lightly doped" LDD source/drain connection zones 16 are formed at the sidewalls of the gate stack or the two layers 4B and 14B in the semiconductor substrate 1 in the customary manner by means of a so-called connection implantation, doping of this type also taking place in the region of the collector connection window KF. These optional LDDs are usually used to achieve a less abrupt doping transition at the gate edge, whereby lower leakage currents are obtained. Furthermore, gate spacers 17S are subsequently formed at the sidewalls of the gate stack, said gate spacers 17S also forming automatically at the side walls of the emitter layer 14A and also the hard mask and the uncovered base connection layer 4A.

In accordance with FIG. 1M, once again according to a standard CMOS process, firstly a second implantation mask 18, which preferably constitutes a photoresist, is produced by means of photolithographic methods and a source/drain implantation $I_4$ is subsequently carried out for the purpose of forming source/drain zones 19 laterally with respect to the gate stack or the gate spacers 17S, but also in the region of the collector connection window KF, a surface region 14BA of the second split gate layer 14B of the gate stack and also a surface region 14AA of the emitter region 14A. In this case, the lower region 14AB of the emitter region 14A and also the lower region 14BB of the second split gate layer 14B of the gate stack are not implanted on account of a low-energy implantation that is preferably used. For this reason, particularly for the emitter layer 14A and the planar emitter geometry thereof, it is possible to dispense with an expensive in situ-doped emitter polydeposition or in situ-doped deposition of the second electrically conductive layer 14, whereby the costs are reduced further.

Figure 1N:
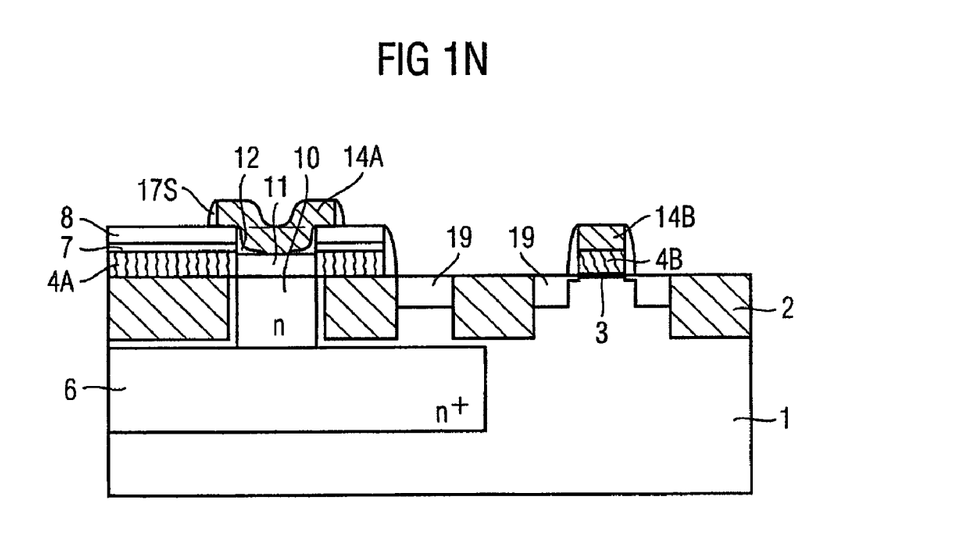

In accordance with FIG. 1N, the implanted impurities are driven into the semiconductor substrate 1 in a so-called source/drain annealing step, thus resulting in deepened source/drain zones 19 and also a corresponding doping zone in the collector connection window in the semiconductor substrate 1. A drive-in of the impurities in the second and possibly also first split gate layer 14B of the gate stack and also the emitter layer 14A is also carried out simultaneously as a result, however, thus resulting in reduced connection resistances (emitter-drive-in). In the region of the emitter, moreover, dopant is driven shallowly into the underlying base epitaxy, where it forms a crystalline emitter region.

Finally, in accordance with FIG. 1O1, in the basic version, a passivation layer 20 having BPSG (borophosphosilicate glass) or BSG (borosilicate glass), for example, is formed over the whole area at the wafer surface, and contacts K for a base B, an emitter E and a collector C of the bipolar transistor and also for a source S, a gate G and a drain D of the field effect transistor are produced therein in a customary manner.

In the alternative version in accordance with FIG. 1O2, this is done in the same way, but a reduced connection resistance with respect to the collector connection zone 6 can be realized in the collector connection window KF on account of the depression in the preceding method step in accordance with FIG. 1K2. In this case, the source/drain implantation furthermore increases the doping of the doping zone 19, thus resulting in extremely good connection properties.

A BiCMOS circuit arrangement which is competitive with conventional CMOS circuits and has outstanding properties with regard to its noise behavior and its radiofrequency properties is obtained in this way with only three additional lithography masks and thus with minimal costs. Cost-effective and high-performance BiCMOS circuits can thus be realized, particularly for so-called wireless applications.

The invention has been described above on the basis of a silicon semiconductor circuit. However, it is not restricted thereto and also encompasses alternative semiconductor materials in the same way. In the same way, it is also possible to use an alternative semiconductor layer, and in particular an alternative compound semiconductor in place of the SiGe base layer. It is therefore intended that the foregoing detailed description be regarded as illustrative rather than limiting, and that it be understood that it is the following claims, including all equivalents, that are intended to define the spirit and scope of this invention.

The invention claimed is:

1. A method for producing a semiconductor circuit arrangement, the method comprising the steps of:
   a) preparing a semiconductor substrate with a bipolar transistor region and a field effect transistor region;
   b) forming a first electrically conductive layer at a surface of the semiconductor substrate for the purpose of realizing a base connection layer in the bipolar transistor region and a first split gate layer in the field effect transistor region;
   c) forming an implantation mask over less than an entire surface of the first electrically conductive layer;
   d) carrying out a first collector implantation for the purpose of forming a collector connection zone in the bipolar transistor region of the semiconductor substrate, the collector connection zone being formed in areas of the substrate not covered by the implantation mask;
   e) forming a hard mask layer at a surface of the first electrically conductive layer;
   f) forming a first etching mask at a surface of the hard mask layer for the purpose of patterning the hard mask layer and for the purpose of uncovering at least one emitter window in the bipolar transistor region;
   g) patterning a base connection layer using the patterned hard mask layer;
   h) carrying out a second collector implantation using the patterned hard mask layer and the base connection layer for the purpose of forming a collector zone in the surface of the semiconductor substrate;
   i) forming a base layer in the region of the emitter window at the surface of the collector zone and at the sidewalls of the base connection layer;
   j) forming a second etching mask at a surface of the patterned hard mask layer for the purpose of uncovering a field effect transistor region;

k) patterning the patterned hard mask layer anew using a second etching mask for the purpose of uncovering a first electrically conductive layer in the field effect transistor region;

l) forming a second electrically conductive layer at a surface of the uncovered first electrically conductive layer, the patterned hard mask and the base layer;

m) forming a third etching mask at a surface of the second electrically conductive layer;

n) patterning a second electrically conductive layer using a third etching mask for the purpose of realizing an emitter layer in the region of the emitter window and a second split gate layer in the field effect transistor region; and o) completing a bipolar transistor in the bipolar transistor region and a field effect transistor in the field effect transistor region.

2. The method of claim 1, wherein the first and second electrically conductive layers have a polycrystalline semiconductor layer.

3. The method of claim 1, wherein step d) comprises:
carrying out a base connection implantation for the purpose of doping the base connection layer using the implantation mask.

4. The method of claim 3, wherein the collector implantation is a high-energy implantation and the base connection implantation is a low-energy implantation.

5. The method of claim 1, wherein step e) comprises:
forming, as hard mask layer, a double layer comprising an etching layer and an emitter/base connection insulation layer.

6. The method of claim 1, wherein step f) comprises:
uncovering a collector connection window in the bipolar transistor region.

7. The method of claim 1, wherein steps f) and g) comprise:
using a dry etching method for patterning the hard mask layer and the base connection layer.

8. The method of claim 1, wherein step i) comprises:
carrying out a selective epitaxy method for laterally growing a side base layer and for horizontally growing a bottom base layer.

9. The method of claim 1, wherein step i) comprises:
forming a compound SiGe semiconductor as the base layer.

10. The method of claim 1, wherein step i) comprises:
forming an inner spacer at least at the sidewalls of the patterned hard mask in the region of the emitter window.

11. The method of claim 1, wherein a photoresist mask is used as implantation mask and as first, second and third etching masks.

12. The method of claim 1, wherein during a doping of the source/drain regions of the field effect transistor, the emitter layer (14A) of the bipolar transistor is doped concurrently.

13. The method of claim 1, wherein the gate of the field effect transistor comprises first and second split gate layers, the first split gate layer being formed concurrently with the base connection layer and the second split gate layer being formed concurrently with the emitter layer for the bipolar transistor.

14. The method of claim 2, wherein the polycrystalline semiconductor layer is a poly-Si layer.

15. The method of claim 5, wherein the etching layer comprises $Si_3N_4$ layer and the emitter/base connection insulation layer comprises $SiO_2$.

16. The method of claim 10, wherein step j) further comprises:
uncovering a region of the collector connection window.

17. A system for producing a semiconductor circuit arrangement, the system comprising:

means for preparing a semiconductor substrate with a bipolar transistor region and a field effect transistor region;

means for forming a first electrically conductive layer at a surface of the semiconductor substrate for the purpose of realizing a base connection layer in the bipolar transistor region and a first split gate layer in the field effect transistor region;

means for forming an implantation mask over less than an entire surface of the first electrically conductive layer;

means for carrying out a first collector implantation for the purpose of forming a collector connection zone in the bipolar transistor region of the semiconductor substrate, the collector connection zone being formed in areas of the substrate not covered by the implantation mask;

means for forming a hard mask layer at a surface of the first electrically conductive layer;

means for forming a first etching mask at a surface of the hard mask layer for the purpose of patterning the hard mask layer and for the purpose of uncovering at least one emitter window in the bipolar transistor region;

means for patterning a base connection layer using the patterned hard mask layer;

means for carrying out a second collector implantation using the patterned hard mask layer and the base connection layer for the purpose of forming a collector zone in the surface of the semiconductor substrate;

means for forming a base layer in the region of the emitter window at the surface of the collector zone and at the sidewalls of the base connection layer;

means for forming a second etching mask at a surface of the patterned hard mask layer for the purpose of uncovering a field effect transistor region;

means for patterning the patterned hard mask layer anew using a second etching mask for the purpose of uncovering a first electrically conductive layer in the field effect transistor region;

means for forming a second electrically conductive layer at a surface of the uncovered first electrically conductive layer, the patterned hard mask and the base layer;

means for forming a third etching mask at a surface of the second electrically conductive layer;

means for patterning a second electrically conductive layer using a third etching mask for the purpose of realizing an emitter layer in the region of the emitter window and a second split gate layer in the field effect transistor region; and means for completing a bipolar transistor in the bipolar transistor region and a field effect transistor in the field effect transistor region.

18. A computer-readable storage medium comprising a set of instructions for directing a system to produce a semiconductor arrangement, the set of instructions to direct the system to perform acts of:

a) preparing a semiconductor substrate with a bipolar transistor region and a field effect transistor region;

b) forming a first electrically conductive layer at a surface of the semiconductor substrate for the purpose of realizing a base connection layer in the bipolar transistor region and a first split gate layer in the field effect transistor region;

c) forming an implantation mask over less than an entire surface of the first electrically conductive layer;

d) carrying out a first collector implantation for the purpose of forming a collector connection zone in the bipolar transistor region of the semiconductor substrate, the collector connection zone being formed in areas of the substrate not covered by the implantation mask;

e) forming a hard mask layer at a surface of the first electrically conductive layer;
f) forming a first etching mask at a surface of the hard mask layer for the purpose of patterning the hard mask layer and for the purpose of uncovering at least one emitter window in the bipolar transistor region;
g) patterning a base connection layer using the patterned hard mask layer;
h) carrying out a second collector implantation using the patterned hard mask layer and the base connection layer for the purpose of forming a collector zone in the surface of the semiconductor substrate;
i) forming a base layer in the region of the emitter window at the surface of the collector zone and at the sidewalls of the base connection layer;
j) forming a second etching mask at a surface of the patterned hard mask layer for the purpose of uncovering a field effect transistor region;
k) patterning the patterned hard mask layer anew using a second etching mask for the purpose of uncovering a first electrically conductive layer in the field effect transistor region;
l) forming a second electrically conductive layer at a surface of the uncovered first electrically conductive layer, the patterned hard mask and the base layer;
m) forming a third etching mask at a surface of the second electrically conductive layer;
n) patterning a second electrically conductive layer using a third etching mask for the purpose of realizing an emitter layer in the region of the emitter window and a second split gate layer in the field effect transistor region; and
o) completing a bipolar transistor in the bipolar transistor region and a field effect transistor in the field effect transistor region.

* * * * *